(12) United States Patent
Bertness

(10) Patent No.: US 8,203,345 B2
(45) Date of Patent: Jun. 19, 2012

(54) STORAGE BATTERY AND BATTERY TESTER

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 298 days.

(21) Appl. No.: 12/328,022

(22) Filed: Dec. 4, 2008

(65) Prior Publication Data

US 2009/0295395 A1 Dec. 3, 2009

Related U.S. Application Data

(60) Provisional application No. 60/992,798, filed on Dec. 6, 2007.

(51) Int. Cl.
G01N 27/416 (2006.01)
G01R 1/04 (2006.01)
(52) U.S. Cl. .......... 324/426; 324/434; 324/156
(58) Field of Classification Search .......... 324/425–454, 324/156, 157; 320/132; 361/600, 625, 626
See application file for complete search history.

(56) References Cited

U.S. PATENT DOCUMENTS

| | | | |
|---|---|---|---|
| 85,553 A | 1/1869 | Adams | 33/472 |
| 2,000,665 A | 5/1935 | Neal | 439/440 |
| 2,417,940 A | 3/1947 | Lehman | 200/61.25 |
| 2,514,745 A | 7/1950 | Dalzell | 324/115 |
| 2,727,221 A | 12/1955 | Springg | 340/447 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 3,808,522 A | 4/1974 | Sharaf | 324/430 |
| 3,811,089 A | 5/1974 | Strzelewicz | 324/170 |

(Continued)

FOREIGN PATENT DOCUMENTS

DE 29 26 716 B1 1/1981

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner* — Huy Q Phan
*Assistant Examiner* — Joshua Benitez
(74) *Attorney, Agent, or Firm* — Westman, Champlin & Kelly, P.A.

(57) ABSTRACT

A storage battery is provided which has a first and second post for electrically coupling to an electrical system. A test plug is provided for use in coupling the storage battery to an electronic battery tester. In another aspect, a battery tester is provided having a plug configured to couple to a test plug of a storage battery for use in performing an electronic battery test on the storage battery.

32 Claims, 6 Drawing Sheets

U.S. PATENT DOCUMENTS

| | | | |
|---|---|---|---|
| 3,816,805 A | 6/1974 | Terry | 320/123 |
| 3,850,490 A | 11/1974 | Zehr | 439/822 |
| 3,873,911 A | 3/1975 | Champlin | 324/430 |
| 3,876,931 A | 4/1975 | Godshalk | 324/429 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 3,997,830 A | 12/1976 | Newell et al. | 320/102 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 701/33 |
| 4,217,645 A | 8/1980 | Barry et al. | 702/63 |
| 4,280,457 A | 7/1981 | Bloxham | 123/198 R |
| 4,297,639 A | 10/1981 | Branham | 324/429 |
| 4,307,342 A | 12/1981 | Peterson | 324/767 |
| 4,315,204 A | 2/1982 | Sievers et al. | 322/24 |
| 4,316,185 A | 2/1982 | Watrous et al. | 340/636.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,441,359 A | 4/1984 | Ezoe | 73/116.06 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/106 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koenck | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,278,759 A | 1/1994 | Berra et al. | 701/1 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |

| | | | | | | | |
|---|---|---|---|---|---|---|---|
| 5,331,268 A | 7/1994 | Patino et al. ............... 320/158 | | 5,684,678 A | 11/1997 | Barrett ....................... 363/17 |
| 5,332,927 A | 7/1994 | Paul et al. .................... 307/66 | | 5,691,621 A | 11/1997 | Phuoc et al. ............... 320/134 |
| 5,336,993 A | 8/1994 | Thomas et al. ............ 324/158.1 | | 5,699,050 A | 12/1997 | Kanazawa ............... 340/636.13 |
| 5,338,515 A | 8/1994 | Dalla Betta et al. ........... 422/95 | | 5,701,089 A | 12/1997 | Perkins ....................... 324/772 |
| 5,339,018 A | 8/1994 | Brokaw ....................... 320/147 | | 5,705,929 A | 1/1998 | Caravello et al. ............ 324/430 |
| 5,343,380 A | 8/1994 | Champlin ..................... 363/46 | | 5,707,015 A | 1/1998 | Guthrie ........................ 241/120 |
| 5,347,163 A | 9/1994 | Yoshimura .................... 307/66 | | 5,710,503 A | 1/1998 | Sideris et al. ............... 320/116 |
| 5,352,968 A | 10/1994 | Reni et al. .................... 320/136 | | 5,711,648 A | 1/1998 | Hammerslag ................ 414/800 |
| 5,357,519 A | 10/1994 | Martin et al. ................ 371/15.1 | | 5,712,795 A * | 1/1998 | Layman et al. ............... 700/297 |
| 5,365,160 A | 11/1994 | Leppo et al. .................. 320/160 | | 5,717,336 A | 2/1998 | Basell et al. ................. 324/430 |
| 5,365,453 A | 11/1994 | Startup et al. .................. 702/36 | | 5,717,937 A | 2/1998 | Fritz ............................ 713/300 |
| 5,369,364 A | 11/1994 | Renirie et al. ................ 324/430 | | 5,721,688 A | 2/1998 | Bramwell ..................... 324/426 |
| 5,381,096 A | 1/1995 | Hirzel ........................... 324/427 | | 5,732,074 A | 3/1998 | Spaur et al. .................. 370/313 |
| 5,387,871 A | 2/1995 | Tsai ............................. 324/429 | | 5,739,667 A | 4/1998 | Matsuda et al. .............. 320/128 |
| 5,402,007 A | 3/1995 | Center et al. ................ 290/40 B | | 5,744,962 A | 4/1998 | Alber et al. ................... 324/426 |
| 3,178,686 A | 4/1995 | Mills ............................ 340/447 | | 5,745,044 A | 4/1998 | Hyatt, Jr. et al. ............. 340/5.23 |
| 5,410,754 A | 4/1995 | Klotzbach et al. ............ 370/466 | | 5,747,189 A | 5/1998 | Perkins .......................... 429/91 |
| 5,412,308 A | 5/1995 | Brown ......................... 323/267 | | 5,747,909 A | 5/1998 | Syverson et al. .......... 310/156.56 |
| 5,412,323 A | 5/1995 | Kato et al. .................... 324/429 | | 5,747,967 A | 5/1998 | Muljadi et al. ............... 320/148 |
| 5,425,041 A | 6/1995 | Seko et al. ................. 372/45.01 | | 5,754,417 A | 5/1998 | Nicollini ....................... 363/60 |
| 5,426,371 A | 6/1995 | Salley et al. .................. 324/429 | | 5,757,192 A | 5/1998 | McShane et al. ............. 324/427 |
| 5,426,416 A | 6/1995 | Jefferies et al. ............... 340/664 | | 5,760,587 A | 6/1998 | Harvey ......................... 324/434 |
| 5,430,645 A | 7/1995 | Keller ....................... 364/424.01 | | 5,772,468 A | 6/1998 | Kowalski et al. ............ 439/506 |
| 5,432,025 A | 7/1995 | Cox ............................... 429/65 | | 5,773,962 A | 6/1998 | Nor ............................... 20/134 |
| 5,432,426 A | 7/1995 | Yoshida ........................ 320/160 | | 5,773,978 A | 6/1998 | Becker .......................... 324/430 |
| 5,434,495 A | 7/1995 | Toko ............................. 320/135 | | 5,778,326 A | 7/1998 | Moroto et al. .................. 701/22 |
| 5,435,185 A | 7/1995 | Eagan ........................... 73/587 | | 5,780,974 A | 7/1998 | Pabla et al. .................... 315/82 |
| 5,442,274 A | 8/1995 | Tamai ........................... 320/146 | | 5,780,980 A | 7/1998 | Naito ............................ 318/139 |
| 5,445,026 A | 8/1995 | Eagan ............................ 73/591 | | 5,789,899 A | 8/1998 | van Phuoc et al. ........... 320/112 |
| 5,449,996 A | 9/1995 | Matsumoto et al. ........... 320/148 | | 5,793,359 A | 8/1998 | Ushikubo ...................... 345/169 |
| 5,449,997 A | 9/1995 | Gilmore et al. ............... 320/148 | | 5,796,239 A | 8/1998 | van Phuoc et al. ........... 320/107 |
| 5,451,881 A | 9/1995 | Finger ........................... 24/433 | | 5,808,469 A | 9/1998 | Kopera ......................... 324/434 |
| 5,453,027 A | 9/1995 | Buell et al. .................... 439/433 | | 5,811,979 A | 9/1998 | Rhein ........................... 324/718 |
| 5,457,377 A | 10/1995 | Jonsson ......................... 324/430 | | 5,818,201 A | 10/1998 | Stockstad et al. ............ 320/119 |
| 5,459,660 A | 10/1995 | Berra ............................. 701/33 | | 5,818,234 A | 10/1998 | McKinnon .................... 324/433 |
| 5,469,043 A | 11/1995 | Cherng et al. ................ 320/161 | | 5,820,407 A | 10/1998 | Morse et al. .................. 439/504 |
| 5,485,090 A | 1/1996 | Stephens ....................... 324/433 | | 5,821,756 A | 10/1998 | McShane et al. ............. 324/430 |
| 5,488,300 A | 1/1996 | Jamieson ...................... 324/432 | | 5,821,757 A | 10/1998 | Alvarez et al. ................ 324/434 |
| 5,504,674 A | 4/1996 | Chen et al. ...................... 705/4 | | 5,825,174 A | 10/1998 | Parker .......................... 324/106 |
| 5,508,599 A | 4/1996 | Koenck ......................... 320/138 | | 5,831,435 A | 11/1998 | Troy ............................. 324/426 |
| 5,519,383 A | 5/1996 | De La Rosa ............... 340/636.15 | | 5,832,396 A | 11/1998 | Moroto et al. .................. 701/22 |
| 5,528,148 A | 6/1996 | Rogers .......................... 320/137 | | 5,850,113 A | 12/1998 | Weimer et al. ................ 307/125 |
| 5,537,967 A | 7/1996 | Tashiro et al. ............. 123/192.1 | | 5,862,515 A | 1/1999 | Kobayashi et al. ............. 702/63 |
| 5,541,489 A | 7/1996 | Dunstan ........................ 320/134 | | 5,865,638 A | 2/1999 | Trafton ......................... 439/288 |
| 5,546,317 A | 8/1996 | Andrieu ......................... 702/63 | | 5,871,858 A | 2/1999 | Thomsen et al. ............... 429/7 |
| 5,548,273 A | 8/1996 | Nicol et al. .................... 340/439 | | 5,872,443 A | 2/1999 | Williamson .................. 320/160 |
| 5,550,485 A | 8/1996 | Falk ............................. 324/772 | | 5,872,453 A | 2/1999 | Shimoyama et al. .......... 324/431 |
| 5,561,380 A | 10/1996 | Sway-Tin et al. ............. 324/509 | | 5,883,306 A | 3/1999 | Hwang ........................ 73/146.8 |
| 5,562,501 A | 10/1996 | Kinoshita et al. ............. 439/852 | | 5,895,440 A | 4/1999 | Proctor et al. .................. 702/63 |
| 5,563,496 A | 10/1996 | McClure ....................... 320/128 | | 5,903,154 A | 5/1999 | Zhang et al. .................. 324/437 |
| 5,572,136 A | 11/1996 | Champlin ..................... 324/426 | | 5,903,716 A | 5/1999 | Kimber et al. ................. 395/114 |
| 5,573,611 A | 11/1996 | Koch et al. .................. 152/152.1 | | 5,912,534 A | 6/1999 | Benedict ........................ 315/82 |
| 5,574,355 A | 11/1996 | McShane et al. ............. 320/161 | | 5,914,605 A | 6/1999 | Bertness ....................... 324/426 |
| 5,578,915 A | 11/1996 | Crouch, Jr. et al. ........... 324/428 | | 5,927,938 A | 7/1999 | Hammerslag ................ 414/809 |
| 5,583,416 A | 12/1996 | Klang ........................... 320/160 | | 5,929,609 A | 7/1999 | Joy et al. ........................ 322/25 |
| 5,585,416 A | 12/1996 | Audett et al. .................. 522/35 | | 5,939,855 A | 8/1999 | Proctor et al. ................ 320/104 |
| 5,585,728 A | 12/1996 | Champlin ..................... 324/427 | | 5,939,861 A | 8/1999 | Joko et al. .................... 320/122 |
| 5,589,757 A | 12/1996 | Klang ........................... 320/160 | | 5,945,829 A | 8/1999 | Bertness ....................... 324/430 |
| 5,592,093 A | 1/1997 | Klingbiel ...................... 324/426 | | 5,946,605 A | 8/1999 | Takahisa et al. ............... 455/68 |
| 5,592,094 A | 1/1997 | Ichikawa ....................... 24/427 | | 5,950,144 A | 9/1999 | Hall et al. .................... 702/108 |
| 5,596,260 A | 1/1997 | Moravec et al. .............. 320/135 | | 5,951,229 A | 9/1999 | Hammerslag ................ 414/398 |
| 5,596,261 A | 1/1997 | Suyama ........................ 320/152 | | 5,955,951 A | 9/1999 | Wischerop et al. .......... 340/572.8 |
| 5,598,098 A | 1/1997 | Champlin ..................... 324/430 | | 5,961,561 A | 10/1999 | Wakefield, II ................. 701/29 |
| 5,602,462 A | 2/1997 | Stich et al. .................... 323/258 | | 5,961,604 A | 10/1999 | Anderson et al. ............. 709/229 |
| 5,606,242 A | 2/1997 | Hull et al. ..................... 320/106 | | 5,969,625 A | 10/1999 | Russo ....................... 340/636.19 |
| 5,614,788 A | 3/1997 | Mullins et al. .................. 315/82 | | 5,973,598 A | 10/1999 | Beigel ........................ 340/572.1 |
| 5,621,298 A | 4/1997 | Harvey ......................... 320/134 | | 5,978,805 A | 11/1999 | Carson ......................... 707/10 |
| 5,633,985 A | 5/1997 | Severson et al. .............. 704/267 | | 5,982,138 A | 11/1999 | Krieger ........................ 320/105 |
| 5,637,978 A | 6/1997 | Kellett et al. ................. 320/104 | | 5,990,664 A | 11/1999 | Rahman ....................... 320/136 |
| 5,642,031 A | 6/1997 | Brotto .......................... 320/156 | | 6,002,238 A | 12/1999 | Champlin ..................... 320/134 |
| 5,650,937 A | 7/1997 | Bounaga ........................ 702/65 | | 6,005,489 A | 12/1999 | Siegle et al. ............... 340/825.69 |
| 5,652,501 A | 7/1997 | McClure et al. .......... 340/636.15 | | 6,005,759 A | 12/1999 | Hart et al. ...................... 361/66 |
| 5,653,659 A | 8/1997 | Kunibe et al. ................. 477/111 | | 6,008,652 A | 12/1999 | Theofanopoulos et al. .. 324/434 |
| 5,654,623 A | 8/1997 | Shiga et al. ................... 320/106 | | 6,009,369 A | 12/1999 | Boisvert et al. ................ 701/99 |
| 5,656,920 A | 8/1997 | Cherng et al. ................ 324/431 | | 6,016,047 A | 1/2000 | Notten et al. ................. 320/137 |
| 5,661,368 A | 8/1997 | Deol et al. ...................... 315/82 | | 6,031,354 A | 2/2000 | Wiley et al. .................. 320/116 |
| 5,666,040 A | 9/1997 | Bourbeau ...................... 320/118 | | 6,031,368 A | 2/2000 | Klippel et al. ................ 324/133 |
| 5,675,234 A | 10/1997 | Greene ...................... 340/636.11 | | 6,037,745 A | 3/2000 | Koike et al. .................. 320/104 |
| 5,677,077 A | 10/1997 | Faulk ............................. 429/90 | | 6,037,749 A | 3/2000 | Parsonage .................... 320/132 |

| Patent No. | Kind | Date | Inventor | Class |
|---|---|---|---|---|
| 6,037,751 | A | 3/2000 | Klang | 320/160 |
| 6,037,777 | A | 3/2000 | Champlin | 324/430 |
| 6,037,778 | A | 3/2000 | Makhija | 324/433 |
| 6,046,514 | A | 4/2000 | Rouillard et al. | 307/77 |
| 6,051,976 | A | 4/2000 | Bertness | 324/426 |
| 6,055,468 | A | 4/2000 | Kaman et al. | 701/29 |
| 6,061,638 | A | 5/2000 | Joyce | 702/63 |
| 6,064,372 | A | 5/2000 | Kahkoska | 345/173 |
| 6,072,299 | A | 6/2000 | Kurle et al. | 320/112 |
| 6,072,300 | A | 6/2000 | Tsuji | 320/116 |
| 6,075,339 | A | 6/2000 | Reipur et al. | 320/110 |
| 6,081,098 | A | 6/2000 | Bertness et al. | 320/134 |
| 6,081,109 | A | 6/2000 | Seymour et al. | 324/127 |
| 6,087,815 | A | 7/2000 | Pfeifer et al. | 323/282 |
| 6,091,238 | A | 7/2000 | McDermott | 324/207.2 |
| 6,091,245 | A | 7/2000 | Bertness | 324/426 |
| 6,094,033 | A | 7/2000 | Ding et al. | 320/132 |
| 6,097,193 | A | 8/2000 | Bramwell | 324/429 |
| 6,100,670 | A | 8/2000 | Levesque | 320/150 |
| 6,100,815 | A | 8/2000 | Pailthorp | 324/754.07 |
| 6,104,167 | A | 8/2000 | Bertness et al. | 320/132 |
| 6,113,262 | A | 9/2000 | Purola et al. | 374/45 |
| 6,114,834 | A | 9/2000 | Parise | 320/109 |
| 6,136,914 | A | 10/2000 | Hergenrother et al. | 524/495 |
| 6,137,269 | A | 10/2000 | Champlin | 320/150 |
| 6,140,797 | A | 10/2000 | Dunn | 320/105 |
| 6,144,185 | A | 11/2000 | Dougherty et al. | 320/132 |
| 6,147,598 | A | 11/2000 | Murphy et al. | 340/426.19 |
| 6,150,793 | A | 11/2000 | Lesesky et al. | 320/104 |
| 6,158,000 | A | 12/2000 | Collins | 713/1 |
| 6,161,640 | A | 12/2000 | Yamaguchi | 180/65.8 |
| 6,163,156 | A | 12/2000 | Bertness | 324/426 |
| 6,164,063 | A | 12/2000 | Mendler | 60/274 |
| 6,167,349 | A | 12/2000 | Alvarez | 702/63 |
| 6,172,483 | B1 | 1/2001 | Champlin | 320/134 |
| 6,172,505 | B1 | 1/2001 | Bertness | 324/430 |
| 6,177,737 | B1 | 1/2001 | Palfey et al. | 307/64 |
| 6,181,545 | B1 | 1/2001 | Amatucci et al. | 361/502 |
| 6,191,557 | B1 | 2/2001 | Gray et al. | 320/132 |
| 6,211,651 | B1 | 4/2001 | Nemoto | 320/133 |
| 6,215,275 | B1 | 4/2001 | Bean | 320/106 |
| 6,218,805 | B1 | 4/2001 | Melcher | 320/105 |
| 6,218,936 | B1 | 4/2001 | Imao | 340/447 |
| 6,222,342 | B1 | 4/2001 | Eggert et al. | 320/105 |
| 6,222,369 | B1 | 4/2001 | Champlin | 324/430 |
| D442,503 | S | 5/2001 | Lundbeck et al. | D10/77 |
| 6,225,808 | B1 | 5/2001 | Varghese et al. | 324/426 |
| 6,236,332 | B1 | 5/2001 | Conkright et al. | 340/3.1 |
| 6,236,949 | B1 | 5/2001 | Hart | 702/64 |
| 6,238,253 | B1 | 5/2001 | Qualls | 439/759 |
| 6,242,887 | B1 | 6/2001 | Burke | 320/104 |
| 6,249,124 | B1 | 6/2001 | Bertness | 324/426 |
| 6,250,973 | B1 | 6/2001 | Lowery et al. | 439/763 |
| 6,254,438 | B1 | 7/2001 | Gaunt | 439/755 |
| 6,259,170 | B1 | 7/2001 | Limoge et al. | 307/10.8 |
| 6,259,254 | B1 | 7/2001 | Klang | 324/427 |
| 6,262,563 | B1 | 7/2001 | Champlin | 320/134 |
| 6,263,268 | B1 | 7/2001 | Nathanson | 701/29 |
| 6,271,643 | B1 | 8/2001 | Becker et al. | 320/112 |
| 6,271,748 | B1 | 8/2001 | Derbyshire et al. | 340/442 |
| 6,275,008 | B1 | 8/2001 | Arai et al. | 320/132 |
| 6,285,191 | B1 | 9/2001 | Gollomp et al. | 324/427 |
| 6,294,896 | B1 | 9/2001 | Champlin | 320/134 |
| 6,294,897 | B1 | 9/2001 | Champlin | 320/153 |
| 6,304,087 | B1 | 10/2001 | Bertness | 324/426 |
| 6,307,349 | B1 | 10/2001 | Koenck et al. | 320/112 |
| 6,310,481 | B2 | 10/2001 | Bertness | 324/430 |
| 6,313,607 | B1 | 11/2001 | Champlin | 320/132 |
| 6,313,608 | B1 | 11/2001 | Varghese et al. | 320/132 |
| 6,316,914 | B1 | 11/2001 | Bertness | 320/134 |
| 6,320,351 | B1 | 11/2001 | Ng et al. | 320/104 |
| 6,323,650 | B1 | 11/2001 | Bertness et al. | 324/426 |
| 6,324,042 | B1 | 11/2001 | Andrews | 361/93.2 |
| 6,329,793 | B1 | 12/2001 | Bertness et al. | 320/132 |
| 6,331,762 | B1 | 12/2001 | Bertness | 320/134 |
| 6,332,113 | B1 | 12/2001 | Bertness | 702/63 |
| 6,346,795 | B2 | 2/2002 | Haraguchi et al. | 320/136 |
| 6,347,958 | B1 | 2/2002 | Tsai | 439/488 |
| 6,351,102 | B1 | 2/2002 | Troy | 320/139 |
| 6,356,042 | B1 | 3/2002 | Kahlon et al. | 318/138 |
| 6,356,083 | B1 | 3/2002 | Ying | 324/426 |
| 6,359,441 | B1 | 3/2002 | Bertness | 324/426 |
| 6,359,442 | B1 | 3/2002 | Henningson et al. | 324/426 |
| 6,363,303 | B1 | 3/2002 | Bertness | 701/29 |
| RE37,677 | E | 4/2002 | Irie | 315/83 |
| 6,377,031 | B1 | 4/2002 | Karuppana et al. | 323/220 |
| 6,384,608 | B1 | 5/2002 | Namaky | 324/430 |
| 6,388,448 | B1 | 5/2002 | Cervas | 324/426 |
| 6,392,414 | B2 | 5/2002 | Bertness | 324/429 |
| 6,396,278 | B1 | 5/2002 | Makhija | 324/402 |
| 6,407,554 | B1 | 6/2002 | Godau et al. | 324/503 |
| 6,411,098 | B1 | 6/2002 | Laletin | 324/436 |
| 6,417,669 | B1 | 7/2002 | Champlin | 324/426 |
| 6,420,852 | B1 | 7/2002 | Sato | 320/134 |
| 6,424,157 | B1 | 7/2002 | Gollomp et al. | 324/430 |
| 6,424,158 | B2 | 7/2002 | Klang | 324/433 |
| 6,437,957 | B1 | 8/2002 | Karuppana et al. | 361/78 |
| 6,441,585 | B1 | 8/2002 | Bertness | 320/132 |
| 6,445,158 | B1 | 9/2002 | Bertness et al. | 320/104 |
| 6,449,726 | B1 | 9/2002 | Smith | 713/340 |
| 6,456,036 | B1 | 9/2002 | Thandiwe | 320/106 |
| 6,456,045 | B1 | 9/2002 | Troy et al. | 320/139 |
| 6,465,908 | B1 | 10/2002 | Karuppana et al. | 307/31 |
| 6,466,025 | B1 | 10/2002 | Klang | 324/429 |
| 6,466,026 | B1 | 10/2002 | Champlin | 324/430 |
| 6,469,511 | B1 | 10/2002 | Vonderhaar et al. | 324/425 |
| 6,477,478 | B1 | 11/2002 | Jones et al. | 702/102 |
| 6,495,990 | B2 | 12/2002 | Champlin | 320/132 |
| 6,497,209 | B1 | 12/2002 | Karuppana et al. | 123/179.3 |
| 6,500,025 | B1 | 12/2002 | Moenkhaus et al. | 439/502 |
| 6,505,507 | B1 | 1/2003 | Imao et al. | 73/146.5 |
| 6,507,196 | B2 | 1/2003 | Thomsen et al. | 324/436 |
| 6,526,361 | B1 | 2/2003 | Jones et al. | 702/63 |
| 6,529,723 | B1 | 3/2003 | Bentley | 455/405 |
| 6,531,848 | B1 | 3/2003 | Chitsazan et al. | 320/153 |
| 6,532,425 | B1 | 3/2003 | Boost et al. | 702/63 |
| 6,534,992 | B2 | 3/2003 | Meissner et al. | 324/426 |
| 6,534,993 | B2 | 3/2003 | Bertness | 324/433 |
| 6,536,536 | B1 | 3/2003 | Gass et al. | 173/2 |
| 6,544,078 | B2 | 4/2003 | Palmisano et al. | 439/762 |
| 6,545,599 | B2 | 4/2003 | Derbyshire et al. | 340/442 |
| 6,556,019 | B2 | 4/2003 | Bertness | 324/426 |
| 6,566,883 | B1 | 5/2003 | Vonderhaar et al. | 324/426 |
| 6,570,385 | B1 | 5/2003 | Roberts et al. | 324/378 |
| 6,577,107 | B2 | 6/2003 | Kechmire | 320/139 |
| 6,586,941 | B2 | 7/2003 | Bertness et al. | 324/426 |
| 6,597,150 | B1 | 7/2003 | Bertness et al. | 320/104 |
| 6,599,243 | B2 | 7/2003 | Woltermann et al. | 600/300 |
| 6,600,815 | B1 | 7/2003 | Walding | 379/93.07 |
| 6,611,740 | B2 | 8/2003 | Lowrey et al. | 701/29 |
| 6,614,349 | B1 | 9/2003 | Proctor et al. | 340/572.1 |
| 6,618,644 | B2 | 9/2003 | Bean | 700/231 |
| 6,621,272 | B2 | 9/2003 | Champlin | 324/426 |
| 6,623,314 | B1 | 9/2003 | Cox et al. | 439/759 |
| 6,624,635 | B1 | 9/2003 | Lui | 24/426 |
| 6,628,011 | B2 | 9/2003 | Droppo et al. | 307/43 |
| 6,629,054 | B2 | 9/2003 | Makhija et al. | 702/113 |
| 6,633,165 | B2 | 10/2003 | Bertness | 324/426 |
| 6,635,974 | B1 | 10/2003 | Karuppana et al. | 307/140 |
| 6,667,624 | B1 | 12/2003 | Raichle et al. | 324/522 |
| 6,679,212 | B2 | 1/2004 | Kelling | 123/179.28 |
| 6,686,542 | B2 | 2/2004 | Zhang | 174/74 |
| 6,696,819 | B2 | 2/2004 | Bertness | 320/134 |
| 6,707,303 | B2 | 3/2004 | Bertness et al. | 324/426 |
| 6,736,941 | B2 | 5/2004 | Oku et al. | 203/68 |
| 6,737,831 | B2 | 5/2004 | Champlin | 320/132 |
| 6,738,697 | B2 | 5/2004 | Breed | 701/29 |
| 6,740,990 | B2 | 5/2004 | Tozuka et al. | 307/9.1 |
| 6,744,149 | B1 | 6/2004 | Karuppana et al. | 307/31 |
| 6,745,153 | B2 | 6/2004 | White et al. | 702/184 |
| 6,759,849 | B2 | 7/2004 | Bertness et al. | 324/426 |
| 6,771,073 | B2 | 8/2004 | Henningson et al. | 324/426 |
| 6,777,945 | B2 | 8/2004 | Roberts et al. | 324/426 |
| 6,781,382 | B2 | 8/2004 | Johnson | 324/426 |
| 6,784,635 | B2 | 8/2004 | Larson | 320/104 |
| 6,784,637 | B2 | 8/2004 | Raichle et al. | 320/107 |
| 6,788,025 | B2 | 9/2004 | Bertness et al. | 320/104 |
| 6,795,782 | B2 * | 9/2004 | Bertness et al. | 702/63 |

| Patent No. | Date | Inventor | Class |
|---|---|---|---|
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,842,707 B2 | 1/2005 | Raichle et al. | 2/62 |
| 6,845,279 B1 | 1/2005 | Gilmore et al. | 700/115 |
| 6,850,037 B2 | 2/2005 | Bertness | 320/132 |
| 6,871,151 B2 | 3/2005 | Bertness | 702/63 |
| 6,885,195 B2 | 4/2005 | Bertness | 324/426 |
| 6,888,468 B2 * | 5/2005 | Bertness | 340/636.15 |
| 6,891,378 B2 * | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,909,356 B2 | 6/2005 | Brown et al. | 340/3.2 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,967,484 B2 | 11/2005 | Bertness | 324/426 |
| 6,972,662 B1 | 12/2005 | Ohkawa et al. | 340/10.1 |
| 6,998,847 B2 | 2/2006 | Bertness et al. | 324/426 |
| 7,003,410 B2 | 2/2006 | Bertness et al. | 702/63 |
| 7,003,411 B2 | 2/2006 | Bertness | 702/63 |
| 7,012,433 B2 | 3/2006 | Smith et al. | 324/426 |
| 7,015,674 B2 | 3/2006 | VonderHaar | 320/103 |
| 7,029,338 B1 | 4/2006 | Orange et al. | 439/755 |
| 7,034,541 B2 | 4/2006 | Bertness et al. | 324/426 |
| 7,039,533 B2 | 5/2006 | Bertness et al. | 702/63 |
| 7,058,525 B2 | 6/2006 | Bertness et al. | 702/63 |
| 7,081,755 B2 | 7/2006 | Klang et al. | 324/426 |
| 7,089,127 B2 | 8/2006 | Thibedeau et al. | 702/63 |
| 7,098,666 B2 * | 8/2006 | Patino | 324/433 |
| 7,102,556 B2 | 9/2006 | White | 341/141 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 | 10/2006 | Kalley | 324/426 |
| 7,154,276 B2 | 12/2006 | Bertness | 324/503 |
| 7,182,147 B2 | 2/2007 | Cutler et al. | 173/1 |
| 7,184,905 B2 | 2/2007 | Stefan | 702/63 |
| 7,198,510 B2 | 4/2007 | Bertness | 439/500 |
| 7,200,424 B2 | 4/2007 | Tischer et al. | 455/567 |
| 7,208,914 B2 | 4/2007 | Klang | 320/132 |
| 7,209,850 B2 | 4/2007 | Brott et al. | 324/426 |
| 7,209,860 B2 | 4/2007 | Trsar et al. | 702/183 |
| 7,212,887 B2 | 5/2007 | Shah et al | 700/276 |
| 7,219,023 B2 | 5/2007 | Banke et al. | 702/58 |
| 7,233,128 B2 | 6/2007 | Brost et al. | 320/132 |
| 7,235,977 B2 | 6/2007 | Koran et al. | 324/426 |
| 7,246,015 B2 | 7/2007 | Bertness et al. | 702/63 |
| 7,272,519 B2 | 9/2007 | Lesesky et al. | 702/63 |
| 7,295,936 B2 | 11/2007 | Bertness et al. | 702/63 |
| 7,319,304 B2 | 1/2008 | Veloo et al. | 320/134 |
| 7,339,477 B2 | 3/2008 | Puzio et al. | 340/572.1 |
| 7,363,175 B2 | 4/2008 | Bertness et al. | 324/426 |
| 7,398,176 B2 | 7/2008 | Bertness | 702/140 |
| 7,408,358 B2 | 8/2008 | Knopf | 324/426 |
| 7,425,833 B2 | 9/2008 | Bertness et al. | 324/426 |
| 7,446,536 B2 | 11/2008 | Bertness | 324/426 |
| 7,453,238 B2 | 11/2008 | Melichar | 320/132 |
| 7,479,763 B2 | 1/2009 | Bertness | 320/134 |
| 7,498,767 B2 | 3/2009 | Brown et al. | 320/107 |
| 7,501,795 B2 | 3/2009 | Bertness et al. | 320/134 |
| 7,505,856 B2 | 3/2009 | Restaino et al. | 702/63 |
| 7,545,146 B2 | 6/2009 | Klang et al. | 324/426 |
| 7,557,586 B1 | 7/2009 | Vonderhaar et al. | 324/437 |
| 7,595,643 B2 | 9/2009 | Klang | 324/426 |
| 7,598,699 B2 | 10/2009 | Restaino et al. | 320/105 |
| 7,598,743 B2 | 10/2009 | Bertness | 324/426 |
| 7,598,744 B2 | 10/2009 | Bertness et al. | 324/426 |
| 7,619,417 B2 | 11/2009 | Klang | 324/427 |
| 7,642,786 B2 | 1/2010 | Philbrook | 324/426 |
| 7,642,787 B2 | 1/2010 | Bertness et al. | 324/426 |
| 7,656,162 B2 | 2/2010 | Vonderhaar et al. | 324/426 |
| 7,657,386 B2 | 2/2010 | Thibedeau et al. | 702/63 |
| 7,679,325 B2 | 3/2010 | Seo | 20/116 |
| 7,688,074 B2 | 3/2010 | Cox et al. | 324/426 |
| 7,705,602 B2 | 4/2010 | Bertness | 324/426 |
| 7,706,991 B2 | 4/2010 | Bertness et al. | 702/63 |
| 7,710,119 B2 | 5/2010 | Bertness | 324/426 |
| 7,723,993 B2 | 5/2010 | Klang | 324/431 |
| 7,728,597 B2 | 6/2010 | Bertness | 324/426 |
| 7,744,149 B2 | 6/2010 | Murray et al. | 307/31 |
| 7,772,850 B2 | 8/2010 | Bertness | 324/426 |
| 7,774,151 B2 | 8/2010 | Bertness | 702/63 |
| 7,777,612 B2 | 8/2010 | Sampson et al. | 340/426.1 |
| 7,791,348 B2 | 9/2010 | Brown et al. | 324/426 |
| 7,808,375 B2 | 10/2010 | Bertness et al. | 340/455 |
| 7,924,015 B2 | 4/2011 | Bertness | 324/427 |
| 7,940,053 B2 * | 5/2011 | Brown et al. | 324/426 |
| 7,999,505 B2 * | 8/2011 | Bertness | 320/104 |
| 2001/0035737 A1 | 11/2001 | Nakanishi et al. | 320/122 |
| 2002/0004694 A1 | 1/2002 | McLeod et al. | 701/29 |
| 2002/0010558 A1 | 1/2002 | Bertness et al. | 702/63 |
| 2002/0021135 A1 | 2/2002 | Li et al. | 324/677 |
| 2002/0041175 A1 | 4/2002 | Lauper et al. | 320/106 |
| 2002/0044050 A1 | 4/2002 | Derbyshire et al. | 340/442 |
| 2002/0118111 A1 | 8/2002 | Brown et al. | 340/573.1 |
| 2002/0171428 A1 | 11/2002 | Bertness | 702/63 |
| 2002/0176010 A1 | 11/2002 | Wallach et al. | 348/362 |
| 2003/0009270 A1 | 1/2003 | Breed | 701/29 |
| 2003/0025481 A1 | 2/2003 | Bertness | 324/426 |
| 2003/0036909 A1 | 2/2003 | Kato | 704/275 |
| 2003/0040873 A1 | 2/2003 | Lesesky et al. | 702/57 |
| 2003/0078743 A1 | 4/2003 | Bertness et al. | 702/63 |
| 2003/0088375 A1 | 5/2003 | Bertness et al. | 702/63 |
| 2003/0128036 A1 | 7/2003 | Henningson et al. | 324/426 |
| 2003/0137277 A1 | 7/2003 | Mori et al. | 320/132 |
| 2003/0169018 A1 | 9/2003 | Berels et al. | 320/132 |
| 2003/0184262 A1 | 10/2003 | Makhija | 320/156 |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0197512 A1 * | 10/2003 | Miller et al. | 324/426 |
| 2003/0212311 A1 | 11/2003 | Nova et al. | 600/300 |
| 2003/0214395 A1 | 11/2003 | Flowerday et al. | 340/445 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0044452 A1 | 3/2004 | Bauer et al. | 703/33 |
| 2004/0049361 A1 | 3/2004 | Hamdan et al. | 702/115 |
| 2004/0051533 A1 | 3/2004 | Namaky | 324/426 |
| 2004/0054503 A1 | 3/2004 | Namaky | 702/183 |
| 2004/0113588 A1 | 6/2004 | Mikuriya et al. | 320/128 |
| 2004/0145342 A1 | 7/2004 | Lyon | 320/108 |
| 2004/0164076 A1 | 8/2004 | Osborne | 320/116 |
| 2004/0178185 A1 | 9/2004 | Yoshikawa et al. | 219/270 |
| 2004/0199343 A1 | 10/2004 | Cardinal et al. | 702/63 |
| 2004/0227523 A1 | 11/2004 | Namaky | 324/537 |
| 2004/0239332 A1 | 12/2004 | Mackel et al. | 324/426 |
| 2004/0251876 A1 * | 12/2004 | Bertness | 320/136 |
| 2005/0007068 A1 | 1/2005 | Johnson et al. | 320/110 |
| 2005/0017726 A1 | 1/2005 | Koran et al. | 324/433 |
| 2005/0021294 A1 | 1/2005 | Trsar et al. | 702/183 |
| 2005/0025299 A1 | 2/2005 | Tischer et al. | 379/199 |
| 2005/0043868 A1 | 2/2005 | Mitcham | 701/29 |
| 2005/0057256 A1 | 3/2005 | Bertness | 324/426 |
| 2005/0102073 A1 | 5/2005 | Ingram | 701/29 |
| 2005/0128083 A1 | 6/2005 | Puzio et al. | 340/572.1 |
| 2005/0156559 A1 * | 7/2005 | Thibedeau et al. | 320/106 |
| 2005/0159847 A1 | 7/2005 | Shah et al. | 700/276 |
| 2005/0162124 A1 * | 7/2005 | Bertness et al. | 320/105 |
| 2005/0168226 A1 | 8/2005 | Quint et al. | 324/426 |
| 2005/0173142 A1 | 8/2005 | Cutler et al. | 173/181 |
| 2005/0182536 A1 | 8/2005 | Doyle et al. | 701/29 |
| 2005/0218902 A1 * | 10/2005 | Restaino et al. | 324/433 |
| 2005/0231205 A1 * | 10/2005 | Bertness et al. | 324/426 |

| | | | | |
|---|---|---|---|---|
| 2005/0254106 A9 | 11/2005 | Silverbrook et al. | ......... | 358/539 |
| 2005/0256617 A1 | 11/2005 | Cawthorne et al. | ............. | 701/22 |
| 2005/0264296 A1* | 12/2005 | Philbrook | ..................... | 324/433 |
| 2006/0012330 A1 | 1/2006 | Okumura et al. | ............. | 320/103 |
| 2006/0030980 A1 | 2/2006 | St. Denis | ......................... | 701/29 |
| 2006/0089767 A1 | 4/2006 | Sowa | .............................. | 701/29 |
| 2006/0217914 A1 | 9/2006 | Bertness | ....................... | 702/113 |
| 2006/0282323 A1 | 12/2006 | Walker et al. | .................... | 705/14 |
| 2007/0024460 A1 | 2/2007 | Clark | ............................ | 340/663 |
| 2007/0026916 A1 | 2/2007 | Juds et al. | .......................... | 463/1 |
| 2007/0194791 A1 | 8/2007 | Huang | .......................... | 324/430 |
| 2008/0303528 A1 | 12/2008 | Kim | ................................ | 324/430 |
| 2008/0303529 A1* | 12/2008 | Nakamura et al. | ............ | 324/433 |
| 2009/0247020 A1 | 10/2009 | Gathman et al. | ............... | 439/759 |
| 2010/0145780 A1 | 6/2010 | Nishikawa et al. | ........ | 705/14.11 |
| 2010/0314950 A1 | 12/2010 | Rutkowski et al. | ............ | 307/125 |
| 2011/0004427 A1 | 1/2011 | Gorbold et al. | ................. | 702/63 |

FOREIGN PATENT DOCUMENTS

| | | |
|---|---|---|
| DE | 196 38 324 | 9/1996 |
| EP | 0 022 450 A1 | 1/1981 |
| EP | 0 637 754 A1 | 2/1995 |
| EP | 0 772 056 A1 | 5/1997 |
| EP | 0 902 521 | 3/1999 |
| EP | 0 982 159 A2 | 3/2000 |
| FR | 2 749 397 | 12/1997 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| JP | 11-150809 | 6/1999 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 99/56121 | 11/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |

OTHER PUBLICATIONS

"Battery Impedance", by E. Willihnganz et al., *Electrical Engineering*, Sep. 1959, pp. 922-925.

"Determining the End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.

IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.

Burr-Brown Corporation, "Design A 60 Hz Notch Filter with the UAF42", Jan. 1994, AB-071, 1994.

National Semiconductor Corporation, "LMF90-4$^{th}$-Order Elliptic Notch Filter", Dec. 1994, RRD-B30M115.

"Alligator Clips with Wire Penetrators" *J.S. Popper, Inc.* product information, downloaded from http://www.jspopper.com/, prior to Oct. 1, 2002.

"#12: LM78S40 Simple Switcher DC to DC Converter", *ITM e-Catalog*, downloaded from http://www.pcbcafe.com, prior to Oct. 1, 2002.

"Simple DC-DC Converts Allows Use of Single Battery", *Electronix Express*, downloaded from http://www.wlexp.com/t_dc-dc.htm, prior to Oct. 1, 2002.

"DC-DC Converter Basics", *Power Designers*, downloaded from http://www.powerdesigners.com/InforWeb.design_center/articles/DC-DC/converter.shtm, prior to Oct. 1, 2002.

"Notification of Transmittal of The International Search Report or the Declaration", PCT/US02/29461.

"Notification of Transmittal of The International Search Report or the Declaration", PCT/US03/07546.

"Notification of Transmittal of The International Search Report or the Declaration", PCT/US03/06577.

"Notification of Transmittal of The International Search Report or the Declaration", PCT/US03/07837.

"Improved Impedance Spectroscopy Technique for Status Determination of Production Li/SO$_2$ Batteries" Terrill Atwater et al., pp. 10-113, (1992).

"Notification of Transmittal of The International Search Report or the Declaration", PCT/US03/41561.

"Notification of Transmittal of The International Search Report or the Declaration", PCT/US03/27696.

"Programming Training Course, 62-000 Series Smart Engine Analyzer", Testproducts Division, Kalamazoo, Michigan, pp. 1-207, (1984).

"Operators Manual, Modular Computer Analyzer Model MCA 3000", Sun Electric Corporation, Crystal Lake, Illinois pp. 1-1-14-13, (1991).

Supplementary European Search Report Communication for Appl. No. 99917402.2; Sep. 7, 2004.

"Dynamic modelling of lead/acid batteries using impedance spectroscopy for parameter identification", Journal of Power Sources, pp. 69-84, (1997).

Notification of Transmittal of the International Search Report for PCT/US03/30707.

"A review of impedance measurements for determination of the state-of-charge or state-of-health of secondary batteries", Journal of Power Sources, pp. 59-69, (1998).

"Search Report Under Section 17" for Great Britain Application No. GB0421447.4.

"Results of Discrete Frequency Immittance Spectroscopy (DFIS) Measurements of Lead Acid Batteries", by K.S. Champlin et al., *Proceedings of 23rd International Teleco Conference (INTELEC)*, published Oct. 2001, IEE, pp. 433-440.

"Examination Report" from the UK Patent Office for App. No. 0417678.0; Jan. 24, 2005.

Wikipedia Online Encyclopedia, Inductance, 2005, http://en.wikipedia.org/wiki/inductance, pp. 1-5, mutual Inductance, pp. 3,4.

"Professional BCS System Analyzer Battery-Charger-Starting", pp. 2-8, (2001).

Young Illustrated Encyclopedia Dictionary of Electronics, 1981, Parker Publishing Company, Inc., pp. 318-319.

"Notification of Transmittal of the International Search Report and the Written Opinion of the International Searching Authority, or the Declaration" for PCT/US2008/008702 filed Jul. 2008; 15 pages.

"A Microprocessor-Based Control System for a Near-Term Electric Vehicle", Bimal K. Bose; IEEE Transactions on Industry Applications, vol. IA-17, No. 6, Nov./Dec. 1981; 0093-9994/81/1100-0626$00.75 © 1981 IEEE, 6 pages.

"DSP Applications in Hybrid Electric Vehicle Powertrain", Miller et al., Proceedings of the American Control Conference, Sand Diego, CA, Jun. 1999; 2 ppg.

Provisional U.S. Appl. No. 60/387,912, filed Jun. 13, 2002 which is related to U.S. Patent No. 7,089,127.

"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).

"Field and Laboratory Studies to Assess the State of Health of Valve-Regulated Lead Acid Batteries: Part I-Conductance/Capacity Correlation Studies", by D. Feder at al., Oct. 1992, pp. 1-15; (19 total pgs.).

"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).

"Conductance Testing of Standby Batteries in Signaling and Communications Applications for the Purpose of Evaluating Battery State-of-Health", by S. McShane, Apr. 1993, pp. 1-9; (14 total pgs.).

"Condutance Monitoring of Recombination Lead Acid Batteries", by B. Jones, May 1993, pp. 1-6; (11 total pgs.).

"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).

"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).

"Field and Laboratory Studies to Access the State-of-Health of Valve-Regulated Lead-Acid Battery Technologies Using Conductance Testing Part II-Further Conductance/Capacity Correlation Studies", by M. Hlavac et al., Sep. 1993, pp. 1-9; (14 total pgs.).

"Field Experience of Testing VRLA Batteries by Measuring Conductance", by M.W. Kniveton, May 1994, pp. 1-4; (9 total pgs.).

"Reducing the Cost of Maintaining VRLA Batteries in Telecom Applications", by M.W. Kniveton, Sep. 1994, pp. 1-5; (10 total pgs.).

"Analysis and Interpretation of Conductance Measurements used to Access the State-of-Health of Valve Regulated Lead Acid Batteries Part III: Analytical Techniques", by M. Hlavac, Nov. 1994, 9 pgs. (13 total pgs.).

"Testing 24 Volt Aircraft Batteries Using Midtronics Conductance Technology", by M. Hlavac et al., Jan. 1995, 9 pgs; (13 total pgs.).

"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).

"VRLA Battery Conductance Monitoring Part V: Strategies for VRLA Battery Testing and Monitoring in Telecom Operating Environments", by M. Hlavac et al., Oct. 1996, 9 pgs; (13 total pgs.).

"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).

"Impedance/Conductance Measurements as an Aid to Determining Replacement Strategies", M. Kniveton, Sep. 1998, pp. 297-301; (9 total pgs.).

"A Fundamentally New Approach to Battery Performance Analysis Using DFRA™ /DTIS™ Technology", by K. Champlin et al., Sep. 2000, 8 pgs; (12 total pgs.).

"Battery State of Health Monitoring, Combining Conductance Technology With Other Measurement Parameters for Real-Time Battery Performance Analysis", by D. Cox et la., Mar. 2000, 6 pgs; (10 total pgs.).

Search Report and Written Opinion from PCT Application No. PCT/US2011/026608, dated Aug. 29, 2011, 9 pages.

Search Report and Written Opinion from PCT Application No. PCT/US2011/038279, dated Sep. 16, 2011, 12 pgs.

Search Report and Written Opinion from PCT Application No. PCT/US2011/026608, dated Aug. 29, 2011, 9 pgs.

* cited by examiner

STORAGE BATTERY AND BATTERY TESTER

The present application is based on and claims the benefit of U.S. provisional patent application Ser. No. 60/992,798, filed Dec. 6, 2007, the content of which is hereby incorporated by reference in its entirety.

BACKGROUND OF THE INVENTION

The present invention relates to storage batteries and electronic battery testers used to test such storage batteries.

Storage batteries, of the type used in automotive vehicles, as backup power sources, etc., typically comprise a plurality of battery plates which form a series of single cells batteries, coupled together to form the storage battery. Various chemistries are used in such batteries.

Storage batteries typically have a limited life span and must be replaced and periodically recharged. Various techniques are known to monitor the condition of such batteries to determine if replacement or recharging is necessary. Midtronics, Inc. of Willowbrook, Ill. and Dr. Keith S. Champlin have pioneered techniques for monitoring such storage batteries. Examples of such techniques are shown and described in U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. No. 6,456,045; U.S. Pat. No. 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued Mar. 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Pat. No. 7,363,175, issued Apr. 22, 2008; U.S. Pat. No. 7,398,176, issued Jul. 8, 2008; U.S. Pat. No. 7,408,358, issued Aug. 5, 2008; U.S. Pat. No. 7,425,833, issued Sep. 16, 2008; U.S. Pat. No. 7,446,536, issued Nov. 4, 2008; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/042,451, filed Jan. 8, 2002, entitled BATTERY CHARGE CONTROL DEVICE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BATTERY REPLACEMENT OUTPUT; U.S. Ser. No. 10/263,473, filed Oct. 2, 2002, entitled ELECTRONIC BATTERY TESTER WITH RELATIVE TEST OUTPUT; U.S. Ser. No. 10/310,385, filed Dec. 5, 2002, entitled BATTERY TEST MODULE; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 10/783,682, filed Feb. 20, 2004, entitled REPLACEABLE CLAMP FOR ELECTRONIC BATTERY TESTER; U.S. Ser. No. 10/791,141, filed Mar. 2, 2004, entitled METHOD AND APPARATUS FOR AUDITING A BATTERY TEST; U.S. Ser. No. 10/867,385, filed Jun. 14, 2004, entitled ENERGY MANAGEMENT SYSTEM FOR AUTOMOTIVE VEHICLE; U.S. Ser. No. 10/896,834, filed Jul. 22, 2004, entitled ELECTRONIC BATTERY TESTER; U.S. Ser. No. 10/958,821, filed Oct. 5, 2004, entitled IN-VEHICLE BATTERY MONITOR; U.S. Ser. No. 10/958,812, filed Oct. 5, 2004, entitled SCAN TOOL FOR ELECTRONIC BATTERY TESTER; U.S. Ser. No. 11/008,456, filed Dec. 9, 2004, entitled APPARATUS AND METHOD FOR PREDICTING BATTERY CAPACITY AND FITNESS FOR SERVICE FROM A BATTERY DYNAMIC PARAMETER AND A RECOVERY VOLTAGE DIFFERENTIAL, U.S. Ser. No. 60/587,232, filed Dec. 14, 2004, entitled CELLTRON ULTRA, U.S. Ser. No. 11/018,785, filed Dec. 21, 2004, entitled WIRELESS BATTERY MONITOR; U.S. Ser. No. 60/653,537, filed Feb. 16, 2005, entitled CUSTOMER MANAGED WARRANTY CODE; U.S. Ser. No. 11/063,247, filed Feb. 22, 2005, entitled ELECTRONIC BATTERY TESTER OR CHARGER WITH DATABUS CONNECTION; U.S. Ser. No. 11/665,070, filed Mar. 24, 2005, entitled OHMMETER PROTECTION CIRCUIT; U.S. Ser. No. 11/141,234, filed May 31, 2005, entitled BATTERY TESTER CAPABLE OF IDENTIFYING FAULTY BATTERY POST ADAPTERS; U.S. Ser. No. 11/143,828, filed Jun. 2, 2005, entitled BATTERY TEST MODULE; U.S. Ser. No. 11/146,608, filed Jun. 7, 2005, entitled SCAN TOOL FOR ELECTRONIC BATTERY TESTER; U.S. Ser. No. 60,694,199, filed Jun. 27, 2005, entitled GEL BATTERY CONDUCTANCE COMPENSATION; U.S. Ser. No. 11/178,550, filed Jul. 11, 2005, entitled WIRELESS BATTERY TESTER/CHARGER; U.S. Ser. No. 60/705,389, filed Aug. 4, 2005, entitled PORTABLE TOOL THEFT PREVENTION SYSTEM, U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 60/712,322, filed Aug. 29, 2005, entitled AUTOMOTIVE VEHICLE ELECTRICAL SYSTEM DIAGNOSTIC DEVICE, U.S. Ser. No. 60/713,168, filed Aug. 31, 2005, entitled LOAD TESTER SIMULATION WITH DISCHARGE COMPENSATION, U.S. Ser. No. 60/731,881, filed Oct. 31, 2005, entitled PLUG-IN FEATURES FOR BATTERY TESTERS; U.S. Ser. No. 60/731,887, filed Oct. 31, 2005, entitled AUTOMOTIVE VEHICLE ELECTRICAL SYSTEM DIAGNOSTIC DEVICE; U.S. Ser. No. 11/304,004, filed Dec. 14, 2005, entitled BATTERY TESTER THAT CALCULATES ITS OWN REFERENCE VALUES; U.S. Ser. No. 60/751,853, filed Dec. 20, 2005, entitled BATTERY MONITORING SYSTEM; U.S. Ser. No. 11/304,004, filed Dec. 14, 2005, entitled BATTERY TESTER WITH CALCULATES ITS OWN REFERENCE VALUES; U.S. Ser. No. 60/751,853, filed Dec. 20, 2005, entitled BATTERY MONITORING SYSTEM; U.S. Ser. No. 11/356,299, filed Feb. 16, 2006, entitled CENTRALLY MONITORED SALES OF STORAGE BATTERIES; U.S. Ser. No. 11/356,443, filed Feb. 16, 2006, entitled ELECTRONIC BATTERY TESTER WITH NETWORK COMMUNICATION; U.S. Ser. No. 11/498,703, filed Aug. 3, 2006, entitled THEFT PREVENTION DEVICE FOR AUTOMOTIVE VEHICLE SERVICE CENTERS; U.S. Ser. No. 11/507,157, filed Aug. 21, 2006, entitled APPARATUS AND METHOD FOR SIMULATING A BATTERY TESTER WITH A FIXED RESISTANCE LOAD; U.S. Ser. No. 11/511,872, filed Aug. 29, 2006, entitled AUTOMOTIVE VEHICLE ELECTRICAL SYSTEM DIAGNOSTIC DEVICE; U.S. Ser. No. 11/519,481, filed Sep. 12, 2006, entitled BROAD-BAND LOW-CONDUCTANCE CABLES FOR MAKING KELVIN CONNECTIONS TO ELECTROCHEMICAL CELLS AND BATTERIES; U.S. Ser. No. 60/847,064, filed Sep. 25, 2006, entitled STATIONARY BATTERY MONITORING ALGORITHMS; U.S. Ser. No. 11/638,771, filed Dec. 14, 2006, entitled BATTERY MONITORING SYSTEM; U.S. Ser. No. 11/641,594, filed Dec. 19, 2006, entitled METHOD AND APPARATUS FOR MEASURING A PARAMETER OF A VEHICLE ELECTRONIC SYSTEM; U.S. Ser. No. 11/711,356, filed Feb. 27, 2007, entitled BATTERY TESTER WITH PROMOTION FEATURE; U.S. Ser. No. 11/811,528, filed Jun. 11, 2007, entitled ALTERNATOR TESTER; U.S. Ser. No. 60/950,182, filed Jul. 17, 2007, entitled BATTERY TESTER FOR HYBRID VEHICLE; U.S. Ser. No. 60/973,879, filed Sep. 20, 2007, entitled ELECTRONIC BATTERY TESTER FOR TESTING STATIONARY BATTERIES; U.S. Ser. No. 11/931,907, filed Oct. 31, 2007, entitled BATTERY MAINTENANCE WITH PROBE LIGHT; U.S. Ser. No. 60/992,798, filed Dec. 6, 2007, entitled STORAGE BATTERY AND BATTERY TESTER; U.S. Ser. No. 12/099,826, filed Apr. 9, 2008, entitled BATTERY RUN DOWN INDICATOR; U.S. Ser. No. 61/061,848, filed Jun. 16, 2008, entitled KELVIN CLAMP FOR ELECTRONICALLY COUPLING TO A BATTERY CONTACT; U.S. Ser. No. 12/168,264, filed Jul. 7, 2008, entitled BATTERY TESTERS WITH SECONDARY FUNCTIONALITY; U.S. Ser. No. 12/174,894, filed Jul. 17, 2008, entitled BATTERY TESTER FOR ELECTRIC VEHICLE; U.S. Ser. No. 12/204,141, filed Sep. 4, 2008, entitled ELECTRONIC BATTERY TESTER OR CHARGER WITH DATABUS CONNECTION; which are incorporated herein in their entirety.

There is an ongoing need for improved methods and techniques for testing and monitoring storage batteries.

SUMMARY OF THE INVENTION

A storage battery is provided which has a first and second post for electrically coupling to an electrical system. A test receptacle is provided for use in coupling the storage battery to an electronic battery tester. In another aspect, a battery tester is provided having a plug configured to couple to a test receptacle of a storage battery for use in performing an electronic battery test on the storage battery.

BRIEF DESCRIPTION OF THE DRAWINGS

FIG. 6 is a schematic diagram showing a test plug including fuse elements or the like.

DETAILED DESCRIPTION OF ILLUSTRATIVE EMBODIMENTS

Various types of storage batteries are known in the art and are used for many purposes including, for example, automotive vehicles, backup power sources, etc. As discussed in the background section, various techniques are used for testing such batteries. The present invention provides a storage battery having a test receptacle which is adapted to couple to an electronic battery tester. Further, the present invention includes an electronic battery tester having a test plug adapted to couple to the test receptacle of the storage battery for use in performing an electronic battery test on the storage battery.

In one specific example, a storage battery is provided having a test receptacle built into the battery housing. The receptacle has 2 or more connections (1-2 to each pole) connected in a standard or Kelvin configuration.

The four connection configuration enables consistent connection of conductance/impedance testing instruments for periodic testing with a handheld device. One problem with portable testers now is that the operator is not consistent in placement of the clamps/probes are placed, resulting in considerable variability for any ohmic test method. A standardized connector would guarantee a consistent and reliable connection.

The 2 or 4 pole configurations provide a simple and quick way to connect a monitoring system. When battery monitoring systems are presently connected, the battery straps must be disconnected in order to attach ring terminals, etc., to the battery in order to make the connections. In this way, the electrical system must be taken off line. With the present invention, the batteries themselves make the system "monitor ready", and cables can be simply plugged in while the battery system remains live. It further eliminates the possibility of incorrect wiring. The 2 pole version can still be used with ohmic measurement methods The 2 poles may be for the sensing function, and a forcing function may be applied across multiple series connected cells.

For monitoring applications, 2 or 4 fuses (number depending on whether a 2 or 4 wire cable is connected) are provided to limit current should the wires become pinched or shorted against a frame rail. In one example, the fuses have a rating of 4 amperes, which is considerably more than either the force current or the sense current, yet significantly smaller than the fusing current of the connection wire (typically 18 gauge). An alternative embodiment is to provide fuses of the automatic reset (PTC, i.e., Positive Temperature Coefficient) type, or standard circuit breakers.

Figure 1:
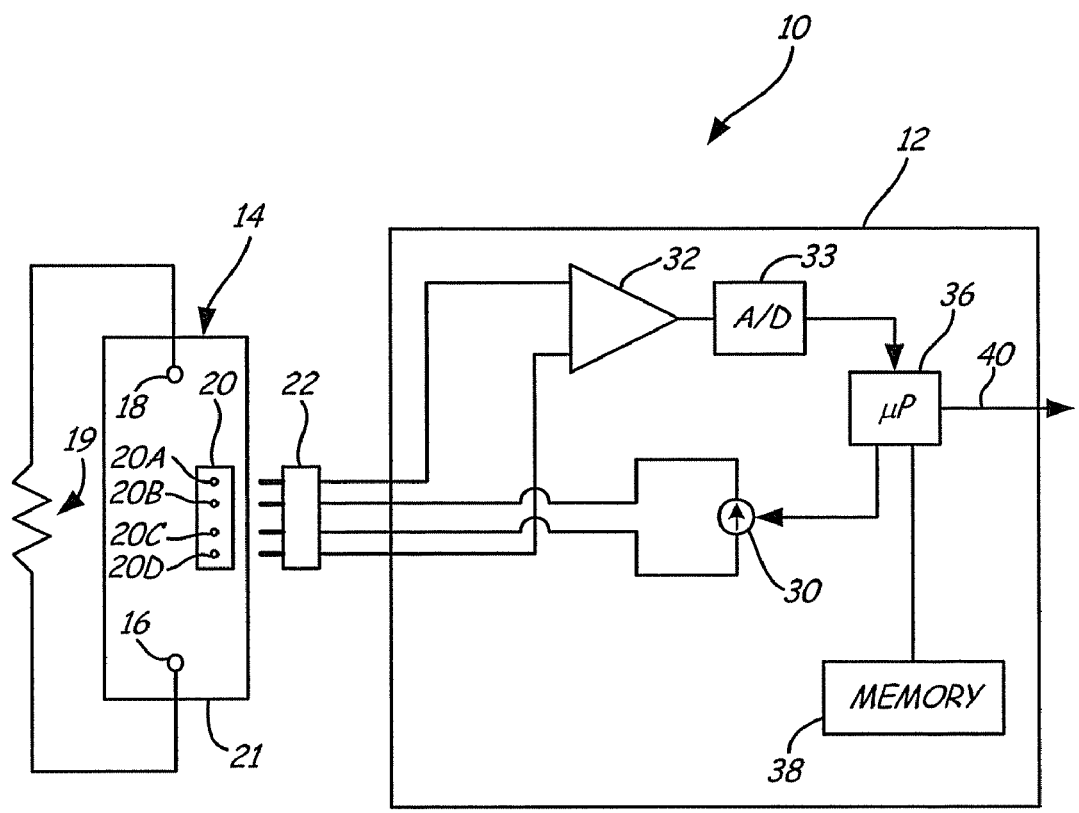
FIG. 1 is a simplified block diagram showing a battery and battery tester in accordance with the present invention.

FIG. 1 is a simplified diagram 10 of a electronic battery tester 12 coupled to a storage battery 14 in accordance with one example embodiment of the present invention. Storage battery 14 includes terminals (or posts) 16 and 18 which are used to couple to an electrical system (illustrated as a resistance) 19, for example of an automotive vehicle, backup power source (such as those used to power cellular telephone sites, power substations, etc), or other device. A test receptacle 20 is provided in a housing 21 of battery 14.

Although FIG. 1 shows a test receptacle having four electrical connections, any number of electrical connections may be employed. A battery tester test plug 22 is provided of battery tester 12 and is configured to plug into test plug 20 and also has four electrical connections. However, any number of connections can be used and they do not need to be the same number as provided by receptacle 20.

Battery tester 12 includes some type of a forcing function generator 30 which provides a time varying signal and a sense amplifier 32. This can be an active or a passive forcing function. In this configuration, the battery tester 12 is configured to perform a test using a Kelvin connection in which a forcing function signal is applied by forcing function generator 30 between cells of the battery 14 and the resultant response the cell is measured by sense amplifier 32. Analog to digital converter 33 receives output from the amplifier 32 and provides a digitized value to a microprocessor 36. The microprocessor 36 operates in accordance with instructions stored in memory 38 and, for example, can determine conductance of the battery 14 using appropriate technique, or perform other tests, including but not limited to those described in the background section. In one configuration, a Kelvin connection is not used and instead a single connection is provided to the battery 14. This can be used, for example, to measure standard resistance, as opposed to a dynamic parameter. Microprocessor 36 provides an output 40 related to the condition of battery 14.

FIG. 1 also illustrates the individual connections 20A, 20B, 20C and 20D of receptacle 20. These are configured to receive individual pins or connectors on plug 22 which couple to connectors or wiring 22A, 22B, 22C and 22D, respectively.

Figure 2:
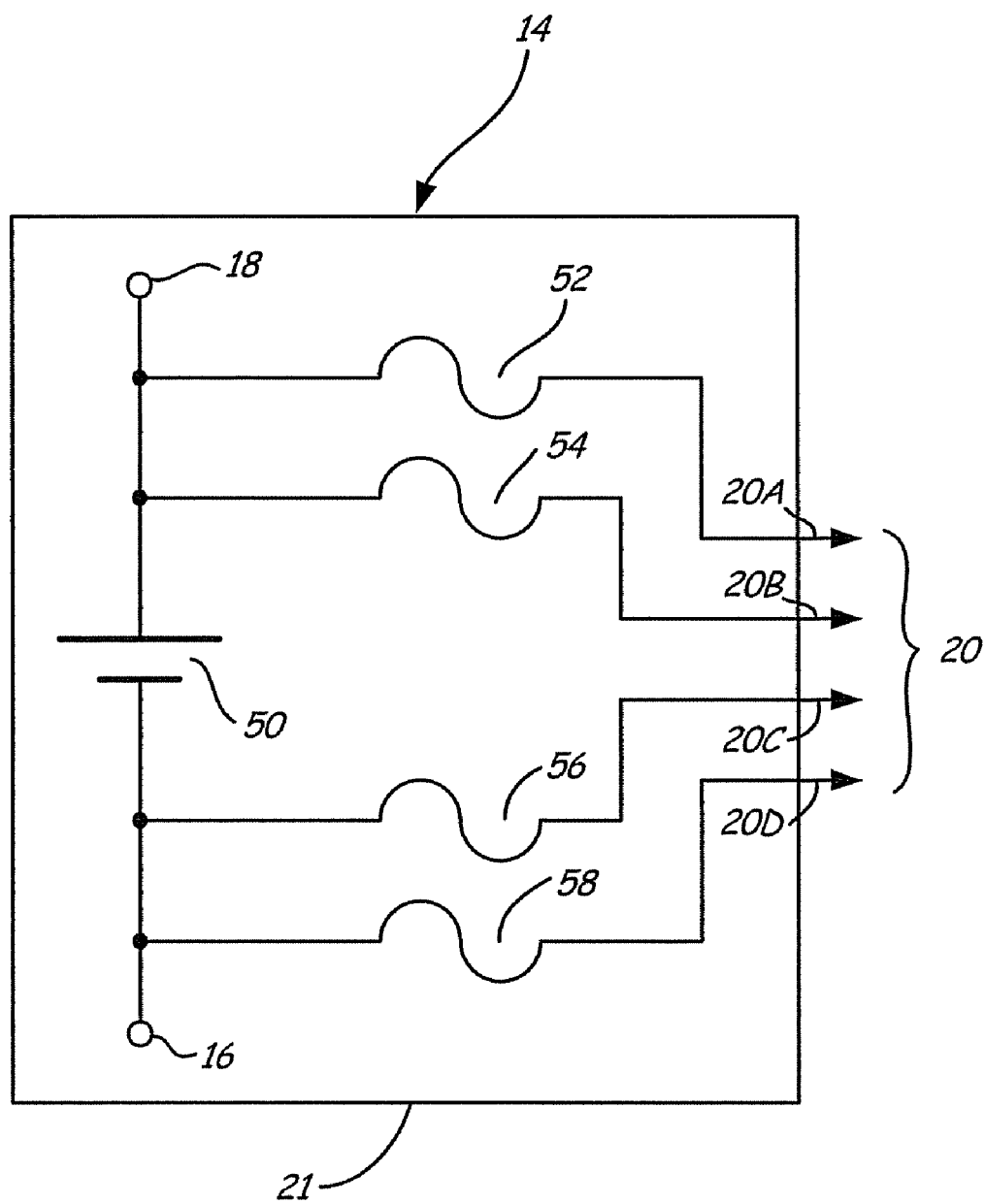
FIG. 2 is a simplified schematic diagram of the battery of FIG. 1.

FIG. 2 is a simplified electrical schematic diagram of battery 14 which shows the electrical connections between test plug 20 and the internal cell or cells 50 of battery 14. Further, as discussed above, fuses 52 54, 56 and 58 are provided which electrically couple plug 20 to the cell or cells 50. These elements may be fuses, automatically resettable fuses (i.e., such as a PTC), circuit breakers or the like. As illustrated in FIG. 2, the plug 20 can be coupled to the battery tester 12 without disturbing the electrical connections to terminals 16 and 18. Although battery 14 illustrated in FIG. 2 shows only a single cell 50, any number of cells 50 may be included. The electrical connection between receptacle 20 and the cell or cells 50 may be configured as desired. For example, the connection can be to individual cells within the battery 14 or may provide a connection across all of the cells 50 within battery 14. Thus, if desired, configurations can be provided which allow testing of individual cells within a battery as opposed to testing all of the cells simultaneously.

Figure 3:
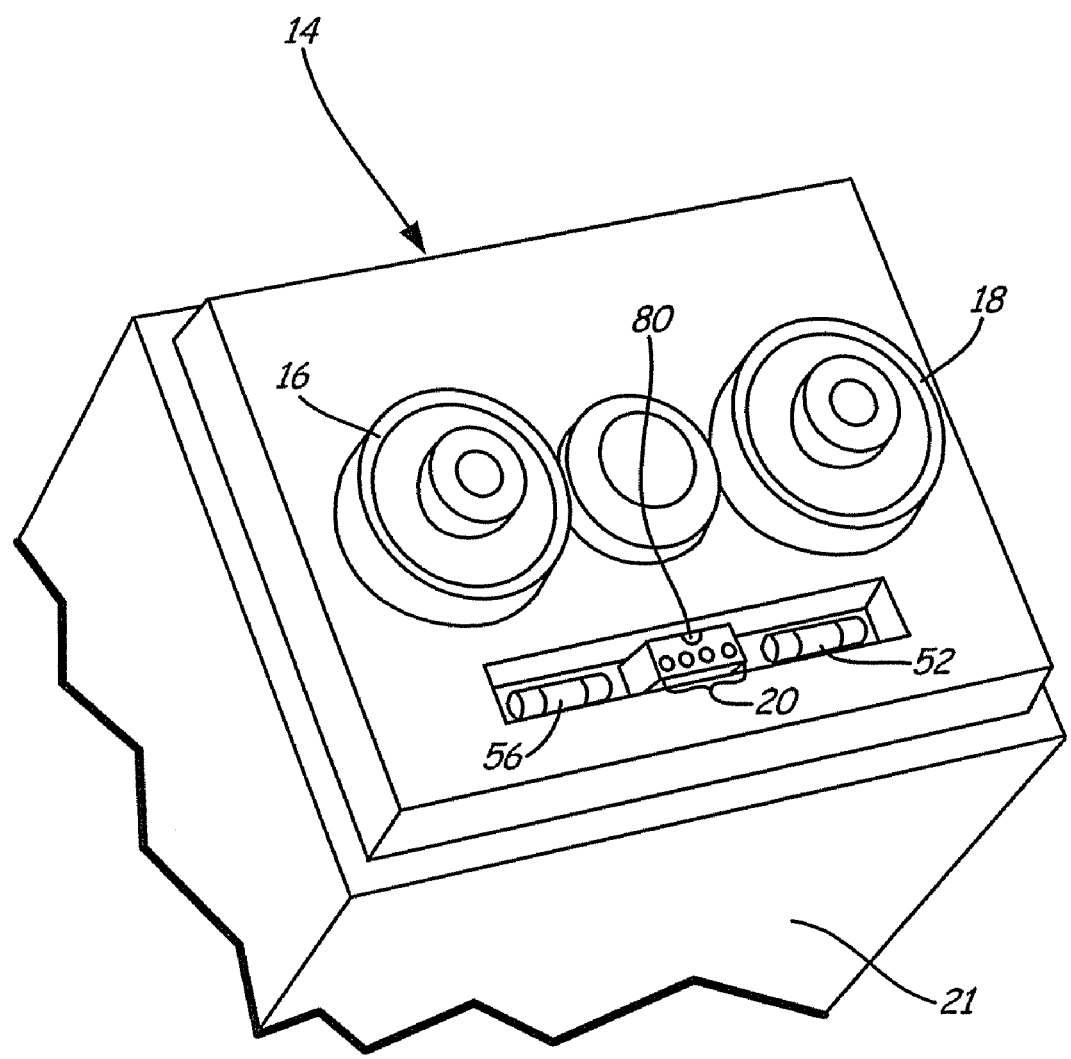
FIG. 3 is a perspective view of the battery of FIG. 1.

FIG. 3 is a perspective view of battery 14 showing posts 16 and 18 and plug 20. In this example, two fuses 52 and 56 are provided and are accessible to an operator. Note that receptacle 20 has a notch or slot 80 formed therein to polarize the receptacle. This provides a polarizing key for use with plug 22. This can be used to ensure that test plug 22 from battery tester 12 is connected with a desired polarity to battery 14.

Figure 4:
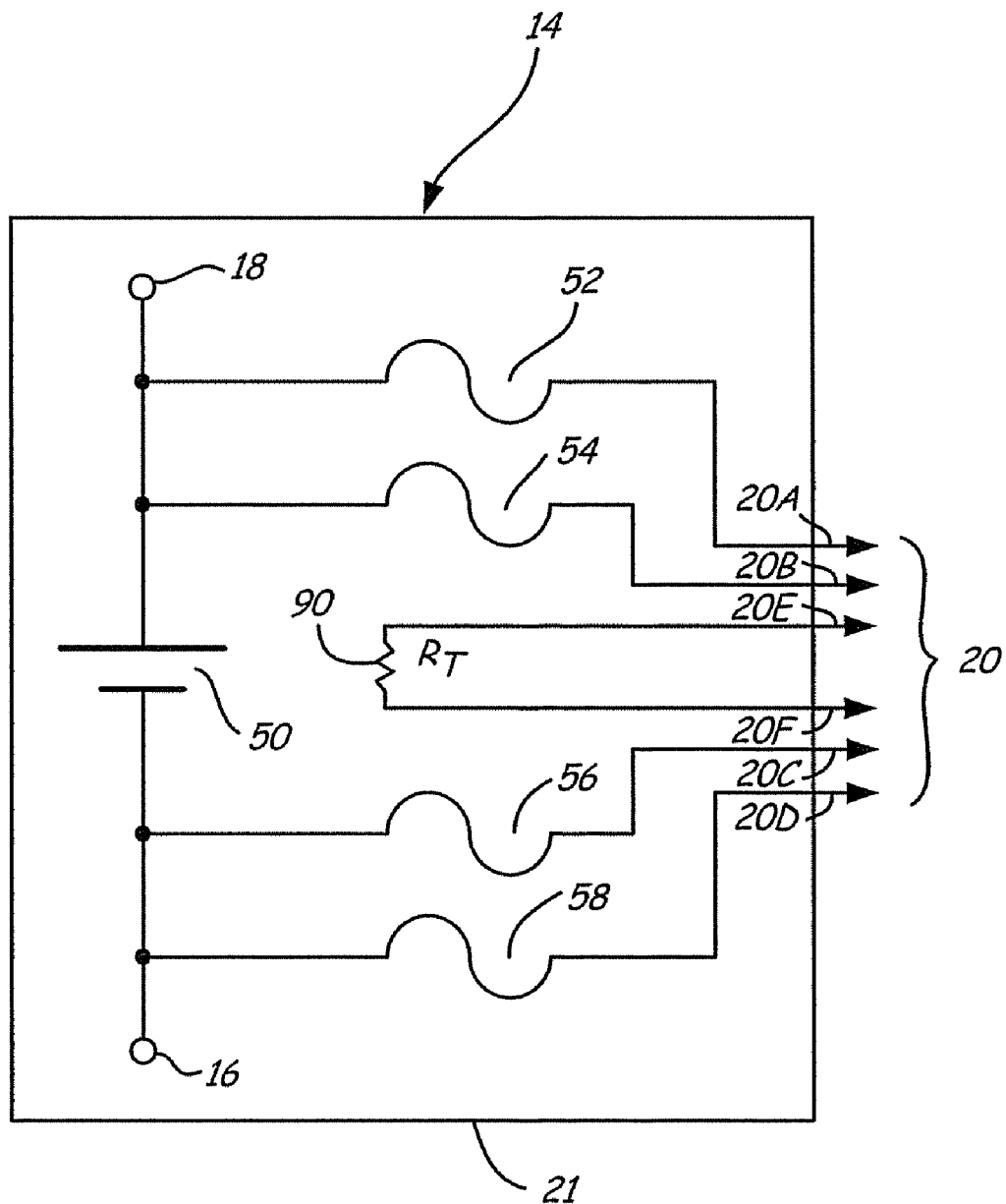
FIG. 4 is a schematic diagram showing a battery in accordance with another embodiment of the present invention having a temperature sensor.

FIG. 4 is a simplified schematic diagram of storage battery 14 in accordance with another example configuration. In FIG.

4, a temperature sensor 90 is provided. In this example, temperature sensor 90 comprises a thermistor which has a resistance which changes as a function of temperature. In such a configuration, additional connections can be provided through receptacle 20. For example, connectors connections 20E and 20F are provided for coupling to temperature sensor 90. In such a configuration, the temperature of the battery, such as the internal battery temperature, can be directly measured by battery tester 12. Referring back to FIG. 1, in this configuration battery tester 12 includes two additional connections to test plug 22 allowing temperature to be measured. The measurement can be made, for example, by applying a current with source 30 through temperature sensor 90 and measuring the resultant voltage drop using amplifier 32.

FIG. 4 is a simplified schematic diagram of another configuration of battery 14. Similar elements have retained their numbering for consistency. In the embodiment of FIG. 4, battery 14 also includes a temperature sensor 90 illustrated as RT. This can comprise, for example, a resistance based temperature sensor in which the resistance of element 90 changes as a function of temperature. The resistance can be measured using any appropriate technique, for example, using forcing function generator 30 and amplifier 32.

In various configurations, the test plug 22 of battery tester 12 may not include a connector for each of the connectors in test receptacle 20. In such a configuration, the battery tester 12 may have access to some of the connections, for example the sense connections and/or the temperature connections, while not having access to other connections. This can be used in combination with slot 80 to provide a polarized connection between plug 22 and test receptacle 20.

Although the receptacle 20 is shown as being positioned on the top of battery 14, the receptacle 20 can be positioned as appropriate, for example, on one of the sides or bottom of the battery 14.

Figure 5:
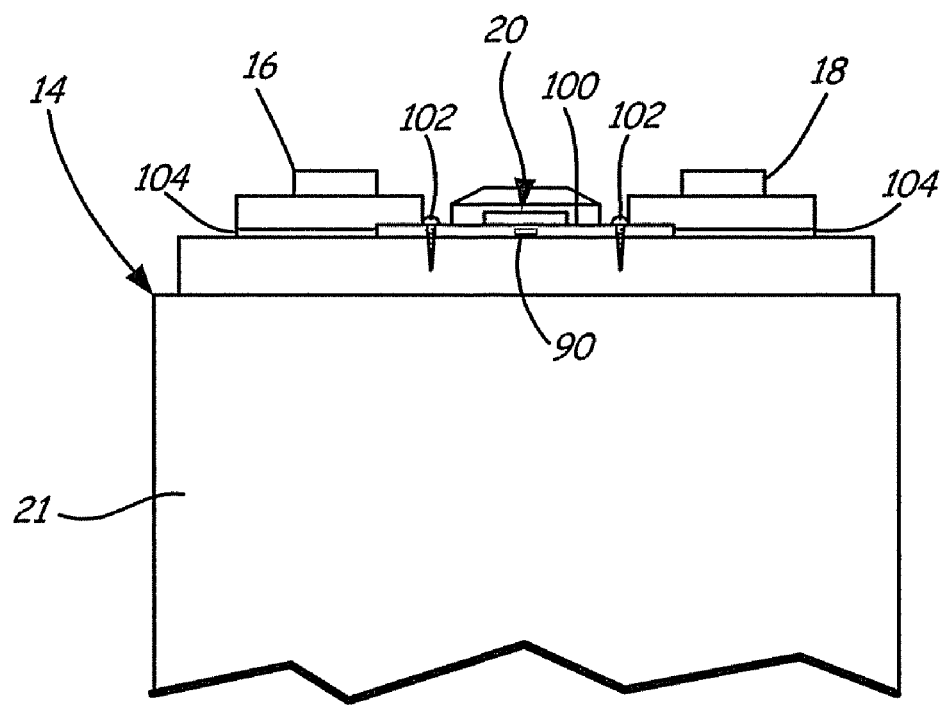
FIG. 5 is a side view of a battery including a test receptacle mount.

FIG. 5 is a side view of battery 16 showing a receptacle mount 100 in accordance with another example configuration. Mount 100 includes post connectors 104 which are configured to electrically couple to battery post 16 and 18. Electrical connections are provided between post connectors 104 and test receptacle 20 as illustrated schematically, for example, in FIG. 2. Attachment mechanisms 102, for example, screws or bolts, are provided to physically couple receptacle mount 100 to the battery housing 16. In one configuration, the temperature sensor 90 is positioned within mount 100. Fuses, PTC elements or circuit breakers 52, 54, 56 and 58 (not shown in FIG. 5) can also be positioned in mount 100. Such a configuration allows the present invention to be easily retrofit with existing batteries, or with existing battery designs, without having to retool the battery manufacturing facilities.

Figure 6:
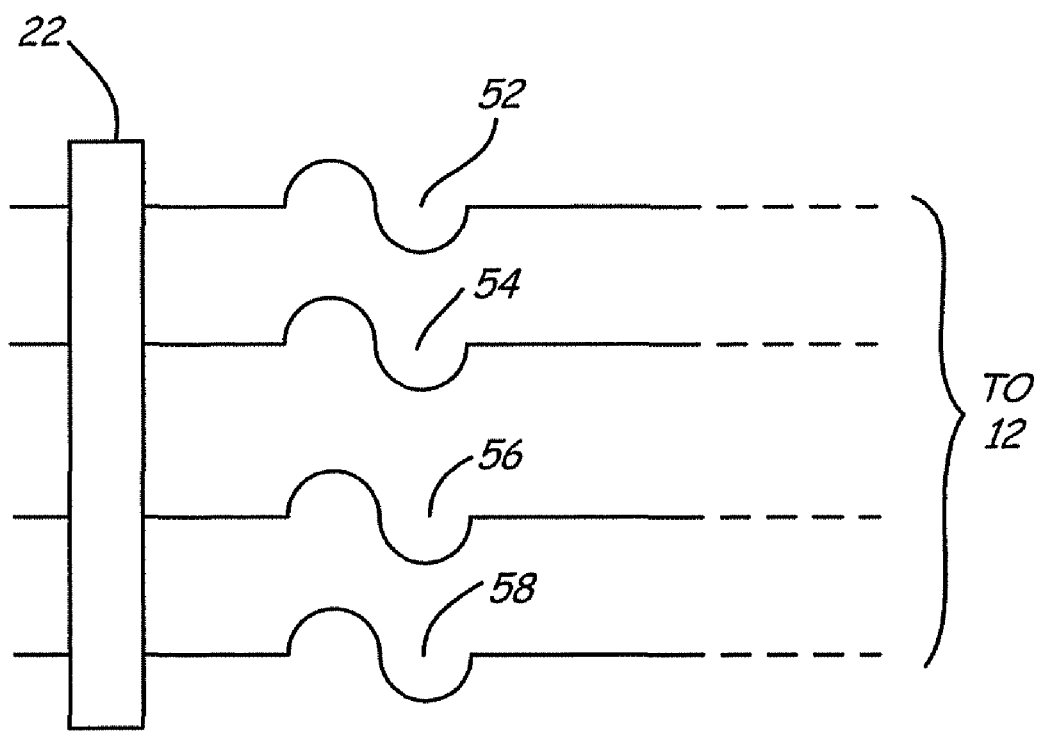

FIG. 6 shows another example configuration of plug 22 in which fuses 52, 54, 56 and 58 are associated with the plug 22 and the battery tester 12. In such a configuration, the fuses 52-58 do not need to be placed in or on the battery 14 thereby reducing the individual costs associated with each battery. As discussed above, elements 52-58 can comprise any appropriate component for preventing a short circuit such as a circuit breaker or PTC element.

Although the present invention has been described with reference to preferred embodiments, workers skilled in the art will recognize that changes may be made in form and detail without departing from the spirit and scope of the invention. Although specific battery configurations, plug configurations and battery tester configurations are shown, the present invention is not limited to these. Further, the plug 20 may include a latch, clip or other mechanism to selectively lock test plug 20 with battery tester plug 22. In one example, element 19 shown in FIG. 1 comprises any automotive vehicle electrical system. Tester 12 can measure a dynamic parameter of battery 14, or some other parameter as desired.

What is claimed is:

1. A storage battery, comprising:
   a housing;
   at least one battery cell in the housing;
   a first terminal electrically coupled to a first end of the at least one battery cell through a first electrical connection, a second electrical terminal mounted to the housing and electrically coupled to a second end of the at least one battery cell, the first and second terminals configured to electrically couple the at least one battery cell to an electrical system;
   a test receptacle mounted to the housing and electrically coupled to the at least one separate battery cell for use in coupling the at least one battery cell to a battery tester, the test receptacle electrically coupled to the at least one battery cell in parallel with the first and second electrical terminals;
   wherein the test receptacle provides a plug configured to releasably electrically couple to a battery test plug of the battery tester, the test receptacle thereby allows the first and second terminals to remain connected to the electrical system, providing a separate electrical connection to the at least one battery cell and providing a consistent electrical connection to the at least one battery cell.

2. The apparatus of claim 1 wherein the test receptacle provides a first connection coupled between the first end of the at least one battery cell and the first terminal and a second connection coupled between the second end of the at least one battery cell and the second terminal.

3. The apparatus of claim 2 wherein the test receptacle includes a third connection electrically coupled to the first end and a fourth connection electrically coupled to the second end of the at least one battery cell.

4. The apparatus of claim 1 including at least one fuse electrically coupled between the first terminal and the test receptacle.

5. An electronic battery tester including the battery tester plug configured to connect to the test receptacle of the battery of claim 1.

6. The apparatus of claim 5 wherein the battery tester includes a forcing function and a sense amplifier.

7. The apparatus of claim 6 wherein the battery tester is configured to measure a dynamic parameter of the storage battery through the test receptacle.

8. The apparatus of claim 5 including an analog to digital converter which is configured to digitize a voltage measured across connectors of the test receptacle.

9. The apparatus of claim 5 wherein the battery tester is further configured to couple to a temperature sensor through the test receptacle.

10. The apparatus of claim 9 wherein the temperature sensor is mounted to the storage battery.

11. The apparatus of claim 5 wherein the battery tester plug and the test receptacle include four connections.

12. The apparatus of claim 5 wherein the battery tester plug and the test receptacle include six connections.

13. The apparatus of claim 5 including at least one fuse electrically coupled between circuitry of the battery tester and the battery tester plug.

14. The apparatus of claim 5 including at least one circuit breaker electrically coupled between circuitry of the battery tester and the battery tester plug.

15. The apparatus of claim 5 including at least one PTC element electrically coupled between circuitry of the battery tester and the battery tester plug.

16. The apparatus of claim 1 including at least one circuit breaker electrically coupled between the first terminal and the test receptacle.

17. The apparatus of claim 1 including at least one PTC element connected between the first terminal and the test receptacle.

18. The apparatus of claim 1 wherein the test receptacle includes a polarity key.

19. The apparatus of claim 1 wherein the test receptacle is attached to a test receptacle mount, the test receptacle mount electrically coupled to the first and second terminals.

20. The apparatus of claim 19 wherein the test receptacle mount includes a temperature sensor.

21. The apparatus of claim 1 wherein the electrical system comprises an automotive vehicle electrical system.

22. The apparatus of claim 1 wherein the electrical system comprises a backup power source electrical system.

23. A method of testing a storage battery of the type which couples to an electric system, comprising:
- providing a first terminal mounted to a housing and electrically coupled to a first end of at least one battery cell through a first electrical connection, a second electrical terminal mounted to the housing and electrically coupled to a second end of the at least one battery cell, the first and second terminals configured to electrically couple to the at least one battery cell;
- electrically coupling a test receptacle to the at least one storage cell of the storage battery, the test receptacle mounted to the housing and electrically coupled to the at least one battery cell in parallel with the first and second electrical terminals;
- electrically connecting a test plug of a battery tester to the test receptacle, the test plug and the test receptacle providing at least four electrical connections, wherein two of the electrical connections are electrically coupled to the first terminal of the battery and two of the electrical connections are electrically coupled to the second terminal of the battery thereby providing Kelvin connections to the first and second terminals;
- coupling a sensor to the battery tester using a plurality of connections provided through the test receptacle;
- applying a forcing function with the battery tester to the storage battery through the test plug and the test receptacle, the forcing function applied between the first and second terminals of the storage battery using a first pair of the electrical connections;
- sensing, in the battery tester through the test plug and the test receptacle, a response to the applied forcing function using a second pair of the electrical connections; and
- determining a battery condition based upon the sensed response;
- wherein the test receptacle provides a plug configured to releasably electrically couple to a battery test plug of the battery tester, the test receptacle thereby allows the first and second terminals to remain connected to the electrical system, providing a separate electrical connection to the at least one battery cell and providing a consistent electrical connection to the at least one battery cell.

24. The method of claim 23 wherein electrically coupling a test receptacle to at least one storage cell of the storage battery comprises coupling a first connection to the first terminal and coupling a second connection to the second terminal.

25. The method of claim 23 including providing at least one fuse electrically coupled between the first terminal and the test receptacle.

26. The method of claim 23 including measuring a dynamic parameter of the storage battery using the battery tester.

27. The method of claim 23 including coupling a temperature sensor in the storage battery to the battery tester.

28. The method of claim 23 including coupling a temperature sensor mounted to the storage battery to the battery tester.

29. The method of claim 23 including coupling the test receptacle to a test receptacle mount, the test receptacle mount electrically coupled to the first and second terminals.

30. The method of claim 23 including sensing temperature at the test receptacle mount with a temperature sensor.

31. The method of claim 23 further comprising electrically coupling the first and second terminals to the electrical system, wherein the electrical system comprises an automotive vehicle electrical system.

32. The method of claim 23 further comprising electrically coupling the first and second terminals to the electrical system, wherein the electrical system comprises a backup power source electrical system.

* * * * *